Nov. 8, 1955 V. A. W. PAGE 2,722,888

RELIEF PLATE FOR PRINTED CIRCUITS

Filed Dec. 21, 1953

Inventor:-
Victor Arthur William Page,
By:- William Edgar Pitt Bagley
Attorney.

United States Patent Office 2,722,888

Patented Nov. 8, 1955

2,722,888

RELIEF PLATE FOR PRINTED CIRCUITS

Victor Arthur William Page, Burnham, England, assignor to The Plessey Company Limited, Ilford, England, a British company Application December 21, 1953, Serial No. 399,192

1 Claim. (Cl. 101—372)

This invention relates to a relief printing plate which is particularly applicable for use in connection with the production of printed circuits.

In the production of printed circuits it has been proposed to apply to a support or to an adhesive coating applied previously thereon a coating of an electrical conducting material in finely divided form, pressing against the particles a heated die or plate with a desired pattern in relief and subsequently removing any unpressed particles. Under this method it is necessary to provide a printing plate or die with a pattern in relief of the requisite circuit; it frequently happens that the circuit is modified, or only a limited number of printed circuits of a particular design are required, consequently each time the circuit is altered, however small the alteration may be, it is necessary to replace the printing plate or die with a fresh one, thereby adding to the cost of production.

According to the methods already proposed for the production of printed circuits, connections between circuit elements are effected by a strip of pressed metallic particles prepared in manner aforesaid. At each of its extremities said strip is terminated with circular discs of similarly formed particles, said discs having in general a larger diameter than the width of the strip, said discs and said strip forming an electrically continuous connection and said disc providing a surface of suitable extent for the attachment by soldering or by riveting of the circuit elements.

An object of the invention is to provide a supporting plate for a die which may be manufactured in quantity and maintained in stock for making dies for new circuits.

A further object of the invention is to provide a plate or die wherein a circuit, still in the development stage, and which is therefore liable to circuit changes, can be altered or modified without the replacement of the complete die.

A still further object of the invention is to provide a printing plate or die which permits the removal of an existing pattern or part thereof and its replacement by a fresh design or part, thereby reducing the cost of production.

The accompanying drawings illustrate a preferred embodiment of the invention in which.

Figure 1:
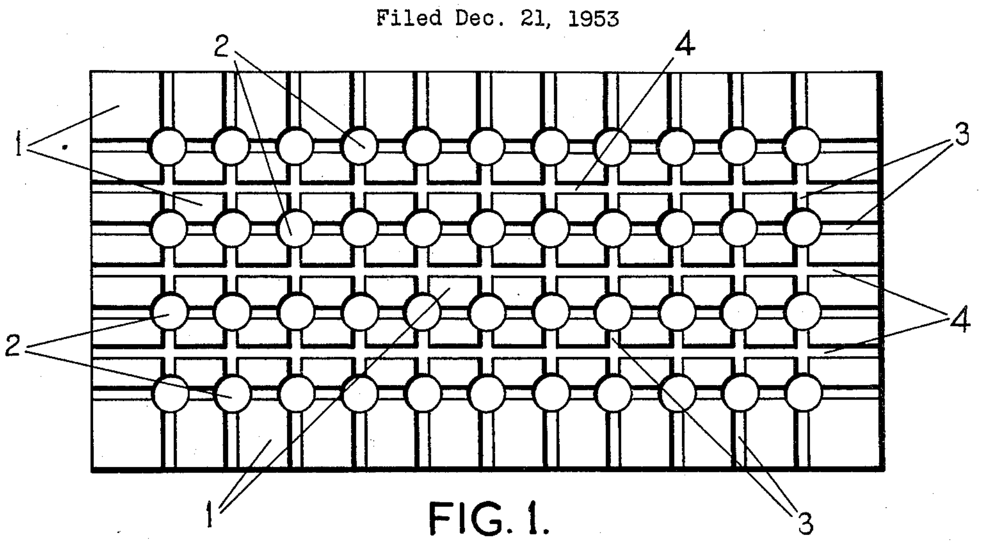
Fig. 1 is a plan view of a plate showing the pin receiving holes and grooves.

According to this invention the plate or die is provided with pin receiving holes and slots or grooves are provided in the face of the plate which coincide with the centre of the holes being adapted to receive suitable conducting strips.

A feature of the invention is that pins can be inserted in the holes in the die plate at which connections are to be made and suitable conducting strips are located in the milled slots between the pins. The pins are secured to the die plate and the strips to the pins by means of solder thereby forming a desired pattern which is ground to a uniform height.

Referring to the drawing:

A rectangular plate 1, of suitable dimension has a number of pin receiving holes 2 arranged in parallel relationship to form a perforated grid. Said plate 1 has on one face thereof a series of longitudinal and transverse grooves 3 which intersect with the centre of the holes 2. An additional number of longitudinal grooves 4 are situated in the spaces between the pin receiving holes 2.

Figures 2, 3:
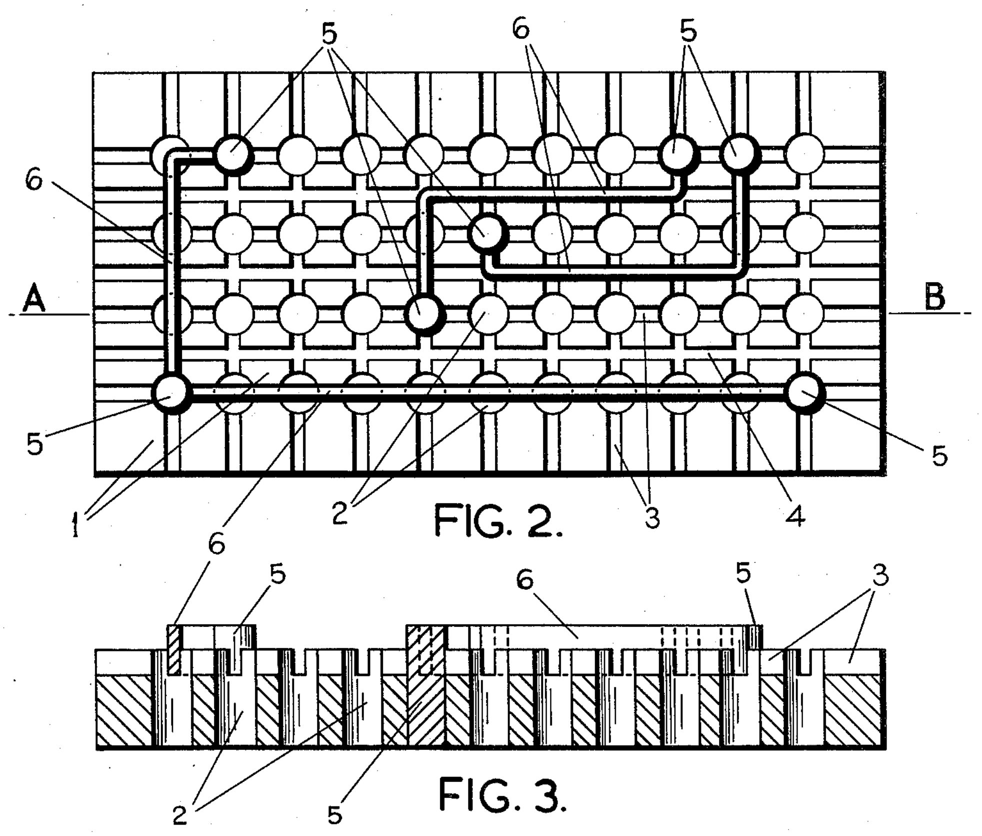
Fig. 2 is a similar view showing an electrically conducting pattern.
Fig. 3 is a section on line A—B of Fig. 2.

To build up a circuit pattern in relief for a printed circuit, pins 5 with flat heads are removably inserted into the pin receiving holes 2, for example, as shown in Fig. 2. Narrow strips of bendable metal 6 are next inserted into the grooves and as shown are bent over at right angles to fit into an intersecting groove 3, thus the strips 6 are made continuous between the pins 5. In general, the pins 5 are of a larger diameter than the metal strips 6 to form a disc of metal during the process of printing and the ends of the strips 6 are preferably soldered to the pins to make an unbroken surface.

The assembly is then ground so that the pre-formed pattern is at a uniform height.

Should it be desirable to modify or replace the circuit pattern, it is only necessary to unsolder the joints, then remove the strip and bend the same strip or other strips to conform with the new design and replace in a manner as hereinbefore described.

I claim:

For the production of printed circuits, a printing plate or die having pin receiving holes with grooves transversely and longitudinally in the face of the plate coinciding with the centre of the pin receiving holes, said plate having an additional longitudinal groove in the spaces between the pin receiving holes, the additional grooves intersecting with the transverse grooves, removable pins inserted into some of the holes in the plate, metal strips inserted into the grooves adjoining the pins, said pins and strips being of a uniform height throughout, and said pins in general of a larger diameter than the width of the strips, whereby a pattern in relief is formed to correspond with a printed circuit.

References Cited in the file of this patent

UNITED STATES PATENTS

| | | |
|---|---|---|
| 106,468 | Crossley | Aug. 16, 1870 |
| 1,306,038 | Trundle | June 10, 1919 |
| 1,831,095 | Conwill | Nov. 10, 1931 |

FOREIGN PATENTS

| | | |
|---|---|---|
| 9,286 | Norway | Mar. 18, 1901 |
| 443,479 | France | Sept. 25, 1912 |